(12) United States Patent
Yamauchi

(10) Patent No.: US 7,045,872 B2
(45) Date of Patent: May 16, 2006

(54) SEMICONDUCTOR LIGHT RECEIVING DEVICE AND MANUFACTURING METHOD FOR THE SAME

(75) Inventor: Hiroshi Yamauchi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/819,772

(22) Filed: Apr. 6, 2004

(65) Prior Publication Data

US 2005/0051816 A1    Mar. 10, 2005

(30) Foreign Application Priority Data

Apr. 9, 2003    (JP) .............................. 2003-104793

(51) Int. Cl.
*H01L 31/00*    (2006.01)
(52) U.S. Cl. ...................... 257/459; 257/443; 257/457
(58) Field of Classification Search ................ 257/443, 257/457, 459
See application file for complete search history.

(56) References Cited

U.S. PATENT DOCUMENTS 3,737,702 A * 6/1973 Kooi et al. .................. 313/367
4,407,010 A * 9/1983 Baji et al. .................... 348/301
5,116,427 A * 5/1992 Fan et al. ..................... 136/259
5,130,773 A * 7/1992 Tsukada ....................... 257/258

FOREIGN PATENT DOCUMENTS

| JP | 58015267 A * | 1/1983 |
| JP | 2001-77339 | 3/2001 |
| JP | 2002-164522 | 6/2002 |
| KR | 1993-0017195 | 8/1993 |
| KR | 2000-0031410 | 6/2000 |

* cited by examiner

*Primary Examiner*—Allan R. Wilson
(74) *Attorney, Agent, or Firm*—Peter J. Manus; David G. Conlin; Edwards Angell Palmer & Dodge LLP

(57) ABSTRACT

An object of the present invention is to provide a highly sensitive semiconductor light receiving device wherein the efficiency of light convergence into the light receiving region has been increased. The semiconductor light receiving device includes a light receiving region formed on a semiconductor substrate, and an electrode formed in a peripheral portion of the light receiving region on the semiconductor substrate for transferring a charge generated through photoelectric conversion in the light receiving region to the outside of the light receiving region, wherein a part of or the entirety of the peripheral portion of the electrode is processed so as to recede toward the center of the electrode as the electrode is away from the semiconductor substrate. In addition, two types of etching of isotropic etching and anisotropic etching are used at the time of the pattern formation of the electrode at least once, respectively.

5 Claims, 3 Drawing Sheets

SEMICONDUCTOR LIGHT RECEIVING DEVICE AND MANUFACTURING METHOD FOR THE SAME

BACKGROUND OF THE INVENTION

1. Field of the Invention

The present invention relates to a semiconductor light receiving device including a light receiving region formed on a semiconductor substrate and an electrode formed in a peripheral portion of the light receiving region on the semiconductor substrate in order to transfer a charge that has been generated through photoelectric conversion in the light receiving region to the outside of the light receiving region, and to a manufacturing method for the same. In particular, the present invention relates to a technique for improving the efficiency of light convergence to the light receiving region.

2. Description of the Related Art

Conventional semiconductor light receiving devices such as a CCD type image pickup device or a MOS type image pickup device are disclosed, for example, in JP-A2002-164522 or in JP-A2001-77339. FIG. 3 is a cross sectional view showing an example of a conventional semiconductor light receiving device.

As shown in FIG. 3, a semiconductor light receiving device has a structure in that an n-type vertical resistor 2, a p$^+$-type channel stopper 3, an n-type light receiving region 4, a p$^{++}$-type hole accumulating region 5 formed in a surface of the light receiving region 4, and a read-out gate 6 existing between the light receiving region 4 and the vertical resistor 2 are formed in a semiconductor substrate 1 (or a p-type well 1 formed in a surface of a semiconductor substrate). Further, a gate insulating film 7, a transfer electrode 8 made of polycrystal silicon, an interlayer insulating film 9 made of $SiO_2$ obtained by thermally oxidizing, for example, polycrystal silicon, a light blocking film 10 made of, for example, aluminum (Al) or tungsten (W), an aperture 11 which is a light receiving window formed by etching and removing a portion of the light blocking film 10 that corresponds to each light receiving region 4, a passivation film 12 formed on the light blocking film 10, a planar film 13 made of resin formed on the passivation film 12, a color filter layer 14 and an on-chip lens 15 are formed on the surface of the semiconductor substrate 1.

Here, the gate insulating film 7 may be, for example, a single layered film of $SiO_2$ (MOS structure) or a three layered film of $SiO_2/SiN/SiO_2$ (MONOS structure). Further, the transfer electrode 8 may be made of the first polycrystal silicon layer or may be made of the second polycrystal silicon layer. FIG. 3 only illustrates the transfer electrode 8 made of one of the first and second polycrystal silicon layers.

Demand for an increase in the number of pixels and for miniaturization is strong for semiconductor light receiving devices such as a solid-state image pickup device and miniaturization of each pixel has been progressing. Accordingly, the amount of light convergence into the light receiving region in each pixel tends to decrease and, corresponding with this, problems such as lowering of sensitivity, deterioration of smear characteristics, increase in dark current and increase in the number of image defects arise. Thus, a decrease in the amount of light convergence due to miniaturization of pixels cannot be avoided to a certain extent, while reflection of a part of light to be incident to the light receiving region 4 caused by the difference in indexes of refraction between silicon Si and silicon oxide $SiO_2$ at the border between the semiconductor substrate (or well) 1 made of silicon Si and the gate insulating film 7 made of, for example, silicon oxide $SiO_2$ formed on the semiconductor substrate 1 can be cited as one factor of the lowering of sensitivity.

In addition, an increase in dark current and an increase in the number of image defects are caused by dangling bonds generated in the vicinity of the surface of the semiconductor substrate 1 where the supply of hydrogen atoms paired with dangling bonds for stabilization becomes insufficient. Furthermore, the surface of the light blocking film 10 made of, for example, aluminum Al is covered with the passivation film 12 made of a glass-based insulator and problems arise where reflections often occur on the surface of the light blocking film 10, so that satin irregularity and flare, which are spurious signals, occur due to those reflections.

In order to cope with these problems, reduction of noise has been found in JP-A 2002-164522 by forming a silicon nitride film after the formation of the aperture 11. In order to further progress in miniaturization, however, a further improvement in the efficiency of light convergence is required. In addition, anisotropic etching (reactive ion etching) suitable for miniaturization has been used in the pattern formation of electrodes in the above-described conventional techniques wherein the electrodes are in the form where the sidewalls are approximately perpendicular to the surface of the substrate.

SUMMARY OF THE INVENTION

The present invention is made in view of the above problems and an object thereof is to provide a highly sensitive semiconductor light receiving device where the efficiency of light convergence into a light receiving region is increased.

Thus, the present inventors have directed their attention to the point that problems such as lowering of convergent efficiency due to miniaturization and lowering of sensitivity caused by this can be solved by optimizing the film thickness and the formation of each element forming the light receiving region and the structure of its periphery in the formation of a semiconductor light receiving device and have found that the convergent efficiency can be increased by carrying out taper processing and rounding processing on the upper peripheral portion of an electrode in the peripheral portion of the light receiving region. In addition, the present inventors have found that the electrical field concentrates on the lower ends of the gate electrodes causing defects in insulation between the electrodes in the case where the lower ends of the gate electrodes have sharp edges though floating gate electrodes are supposed to be electrically insulated by means of a gate insulating film interposed therebetween and that can be improved.

In order to achieve the above object, a semiconductor light receiving device according to the present invention includes a light receiving region formed on a semiconductor substrate and an electrode formed in a peripheral portion of the light receiving region on the semiconductor substrate in order to transfer charges generated through photoelectric conversion in the light receiving region to the outside of the light receiving region. Apart of or the entirety of the peripheral portion of the electrode is processed so as to recede toward the center of the electrode as the electrode is away from the semiconductor substrate. Further, it is preferable for the upper peripheral portion of the electrode to be processed so as to recede toward the center of the electrode as the electrode is away from the semiconductor substrate.

In the semiconductor light receiving device according to the present invention, the upper peripheral portion of the electrode formed in the peripheral portion of the light receiving region is processed so as to recede toward the center of the electrode starting from the bottom that makes contact with the gate insulating film; therefore, the corresponding upper peripheral portions of the interlayer insulating film and light blocking film that cover the electrode also recede toward the center of the electrode in the same manner that the aperture provided in the upper portion of the light receiving region has a structure in that the aperture area becomes greater towards the upper portion and incident light is not interrupted by the upper peripheral portion of the electrode, increasing the efficiency of the convergent light into the light receiving region resulting in the achievement of an increase in the light receiving sensitivity.

A manufacturing method for semiconductor light receiving device according to the present invention in order to achieve the above object has features in that the semiconductor light receiving device includes a light receiving region formed on a semiconductor substrate and an electrode formed in a peripheral portion of the light receiving region on the semiconductor substrate in order to transfer charges generated through photoelectric conversion in the light receiving region to the outside of the light receiving region, and two types of etching of isotropic etching and anisotropic etching are used at the time of the pattern formation of the electrode at least once respectively.

In addition to the above-described features, the manufacturing method for a semiconductor light receiving device according to the present invention has features in that the anisotropic etching is carried out after the isotropic etching has been carried out at the time of the pattern formation of the electrode, and the isotropic etching is carried out on the electrode using radicals that include at least one type of gas from among $SF_4$, $CF_4$, $CHF_3$, $CH_2F_2$, $CH_3F$, $C_2F_6$, $C_4F_8$ and $C_5F_8$ as well as at least one type of gas from among Ar, $N_2$ and $O_2$.

In the manufacturing method for semiconductor light receiving device according to the present invention, the electrode is etched in the lateral direction toward the center thereof through isotropic etching; therefore, the portion of the electrode to be isotropically etched recedes toward the center and toward the upper portion. Accordingly, the electrode can be freely formed by combining the two types of etching of isotropic etching and anisotropic etching. In addition, the upper peripheral portion of the electrode formed in the peripheral portion of the light receiving region can be processed so as to recede toward the center of the electrode starting from the bottom that makes contact with the gate insulating film; therefore, the corresponding upper peripheral portions of the interlayer insulating film and light blocking film that cover the electrode also recede toward the center of the electrode in the same manner, and the aperture provided above the light receiving region has a structure in that the aperture area increases toward the upper portion. As a result of this, the efficiency of the light convergence into the light receiving region of the semiconductor light receiving device increases and a highly sensitive semiconductor light receiving device can be manufactured.

In particular, the upper peripheral portion of the electrode can be processed so as to recede toward the center of the electrode and toward the upper portion by carrying out the anisotropic etching after the isotropic etching has been carried out at the time of the pattern formation of the electrode; therefore, the area of the aperture of the upper portion can be spread while effectively securing the width of a microscopic electrode wire.

DETAILED DESCRIPTION OF THE INVENTION

In the following, a semiconductor light receiving device and a manufacturing method for the same (hereinafter, appropriately referred to as "the inventive device" and "the inventive method") according to the embodiments of the present invention will be described with reference to FIGS. 1 and 2A to 2D. Here, the same symbols are attached to the parts and to the components which are the same as in the conventional semiconductor light receiving device illustrated in FIG. 3.

Figure 1:
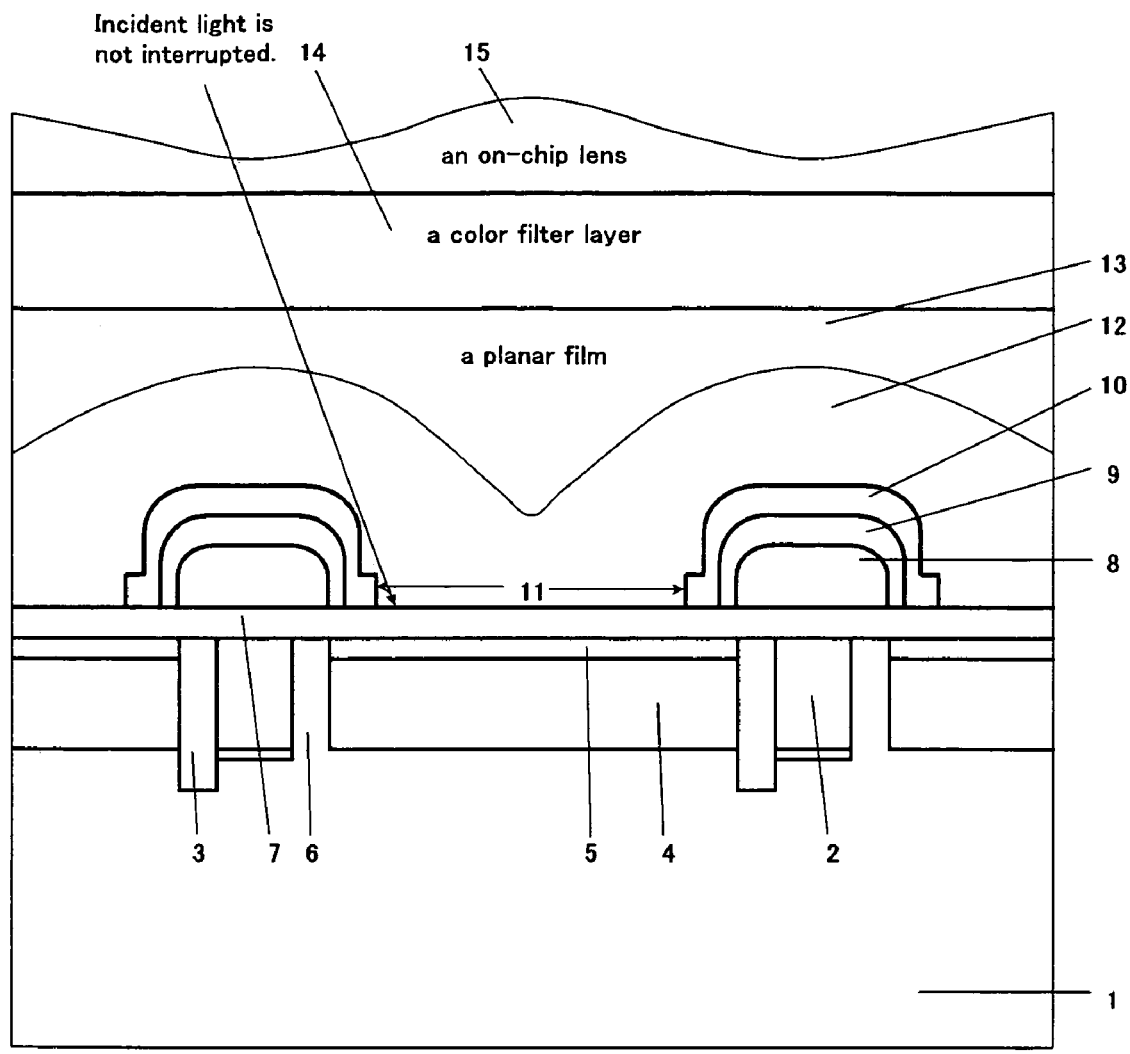
FIG. 1 is a cross sectional view showing the structure of a semiconductor light receiving device according to one embodiment of the present invention.

As shown in FIG. 1, the inventive device has a structure in that an n-type vertical resistor 2, a $p^+$-type channel stopper 3, an n-type light receiving region 4, a $p^{++}$-type hole accumulating region 5 formed in the surface of the light receiving region 4, and a read-out gate 6 existing between the light receiving 4 and the vertical resistor 2 are formed in a p-type semiconductor substrate 1 (or p-type well 1 formed in the surface of a semiconductor substrate, hereinafter both are referred to as semiconductor substrate 1). Further, a gate insulating film 7, a transfer electrode 8 made of polycrystal silicon, an interlayer insulating film 9, a light blocking film 10, an aperture 11, a passivation film 12 formed on the light blocking film 10, a planar film 13 made of resin formed on the passivation film 12, a color filter layer 14 and an on-chip lens 15 are formed on the surface of the semiconductor substrate 1.

Here, the gate insulating film 7 is made of, for example, a single layered film of $SiO_2$ (MOS structure) or a three layered film of $SiO_2/SiN/SiO_2$ (MONOS structure). As for the film thickness of the gate insulating film 7, for example, 50 to 60 nm is appropriate in the case of the single layered film of $SiO_2$ (MOS structure), and $SiO_2$ of 10 nm/SiN of 40 nm/$SiO_2$ of 30 nm (thicknesses of the respective layers in the order from the upper layer to the lower layer) are appropriate in the case of the three layered film of $SiO_2/SiN/SiO_2$ (MONOS structure). However, the present invention is not necessarily limited to such structures.

The transfer electrode 8 may be formed of the first polycrystal silicon layer or may be formed of the second polycrystal silicon layer. FIG. 1 only illustrates the transfer electrode 8 made of one of the first and second polycrystal silicon layers. The entirety of the transfer electrode 8 is rounded in form as shown in FIG. 1 wherein the shoulders (upper peripheral portions) are rounded in tapered form according to the inventive method to be described later. Here, a control voltage is applied to the transfer electrode 8 from the outside in order to transfer charges generated through photoelectric conversion by the energy of light incident into the light receiving region 4 to the n-type vertical resistor 2 outside of the light receiving region 4.

The interlayer insulating film 9 is made of, for example, BPSG (Boro-Phospho Silicate Glass). The light blocking film 10 is formed of, for example, tungsten and the portion corresponding to each light receiving region 4 is etched and removed, so that the aperture 11 is formed. The aperture 11 functions as a light receiving window.

As described above, the shoulders of the protruding form of an electrode part including the electrode 8, the interlayer insulating film 9 and the light blocking film 10 are rounded, so that the efficiency of light convergence is increased and an increase in the sensitivity can be achieved according to the inventive device shown in FIG. 1.

In addition, in the case where the same electrodes as the transfer electrode 8 exist in a plurality of layers (for example, two layers), each transfer electrode 8 is electrically isolated by means of the interlayer insulating film from other transfer electrodes 8 in floating conditions during the manufacturing process; therefore, there is no path for releasing charges in the case where the transfer electrode 8 in a floating condition is charged due to a particular factor. Accordingly, the concentration of the electrical field can be relieved in the lower end of the transfer electrode 8 in such a floating condition in the case where the form of the transfer electrode 8 is rounded in the cross section, thereby lowering the possibility of defective insulation between transfer electrodes 8 due to the above-described concentration of the electrical field.

Next, the inventive method will be described with reference to FIGS. 2A to 2D. FIGS. 2A to 2D are cross-sectional views showing the main part of the inventive device during the manufacturing process of the inventive method.

Figure 2A:
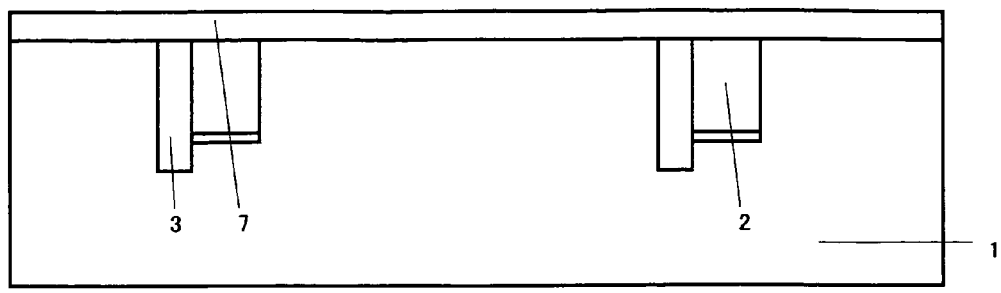
FIGS. 2A to 2D are cross sectional views each showing the main part of a semiconductor light receiving device during the manufacturing process for describing a manufacturing method of the semiconductor light receiving device according to one embodiment of the present invention.
Figure 3:
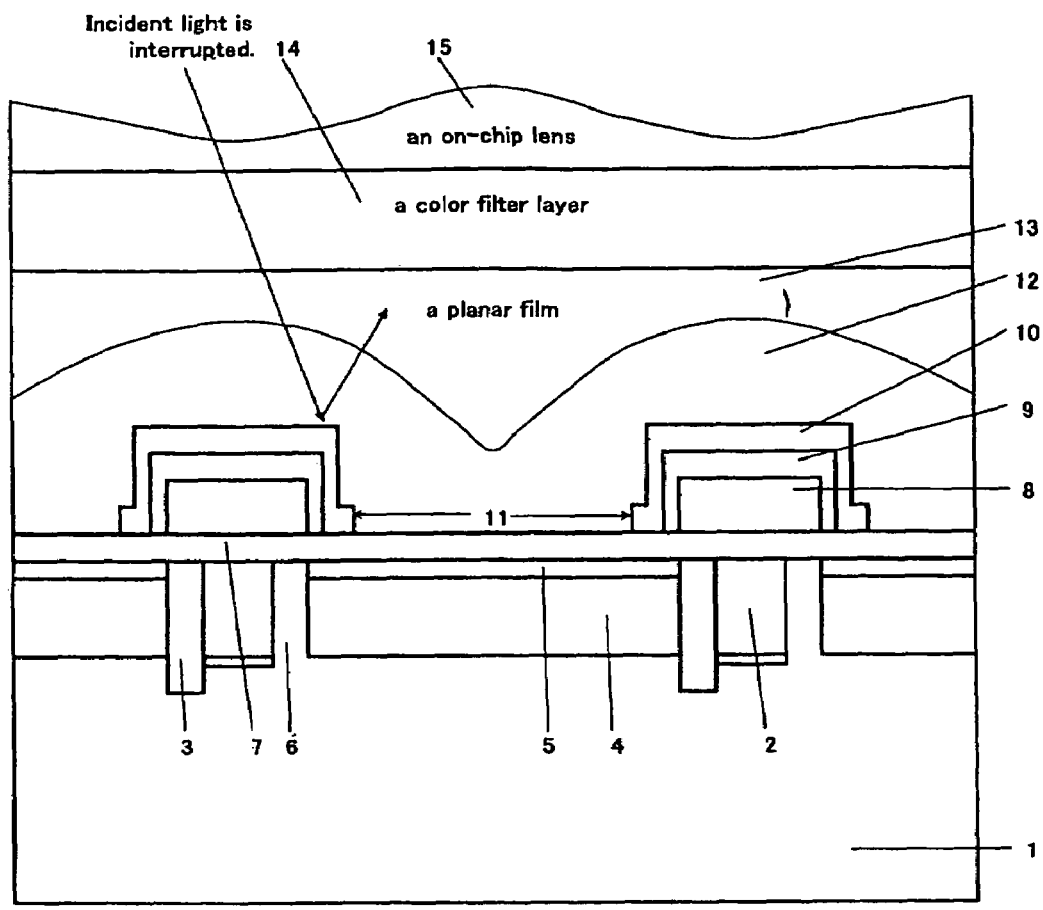
FIG. 3 is a cross sectional view showing the structure of an example of a conventional semiconductor light receiving device.

First, as shown in FIG. 2A, the resistor 2 for transfer, the channel stopper 3 and the like are formed in the semiconductor substrate 1 by means of ion implantation or the like and, after that, a field insulating film (not shown) is formed by means of, for example, selective oxidation. Subsequently, the surface of the semiconductor substrate 1 is thermally oxidized, so that the gate insulating film 7 is formed. Here, in the case of the MONOS structure, the gate insulating film 7 is formed of an insulating film having a three layered structure of $SiO_2/SiN/SiO_2$. In this case, the SiN film of the second layer and the $SiO_2$ film of the third layer are formed by means of, for example, LP (Lower Pressure)-CVD (Chemical Vapor Deposition). FIG. 2A shows the condition after the formation of gate insulating film 7.

Figure 2B:
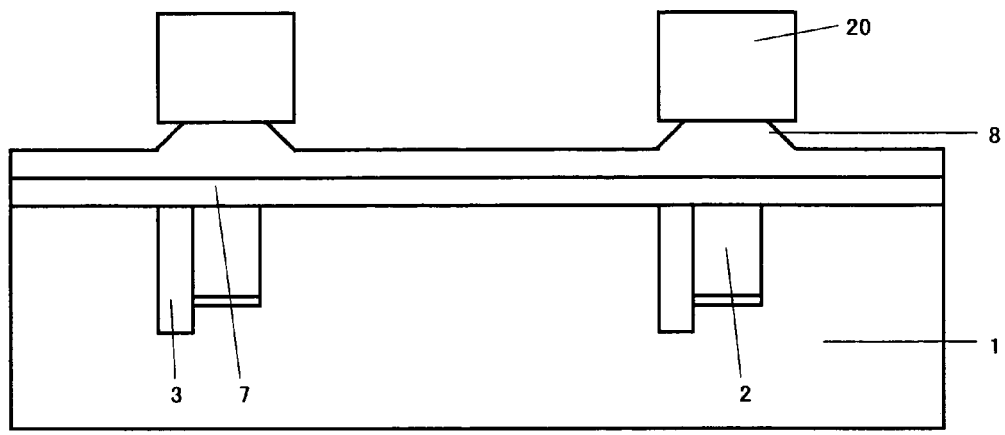

Next, as shown in FIG. 2B, a polycrystal silicon layer or a metal silicide layer which becomes the transfer electrode 8 of the first layer is formed on the gate insulating film 7, and this electrode layer of the first layer is patterned using a photoresist 20 that has been formed in the portion of electrode formation as a mask. First, this patterning is started by means of isotropic etching. Here, according to this isotropic etching, for example, 300 sccm of $CF_4$ gas and 120 sccm of $O_2$ gas are mixed while maintaining a pressure of 40 Pa and the mixed gas is excited by means of microwaves so that the generated radicals are carried into a chamber in which a wafer is placed through a wave guide and, thus, the wafer is processed with the plasma as shown in FIG. 2B. At this time, the temperature of the wafer stage is set at, for example, 25° C. Here, FIG. 2B shows the condition after the isotropic etching has been completed and immediately before the start of the subsequent anisotropic etching.

Figure 2C:
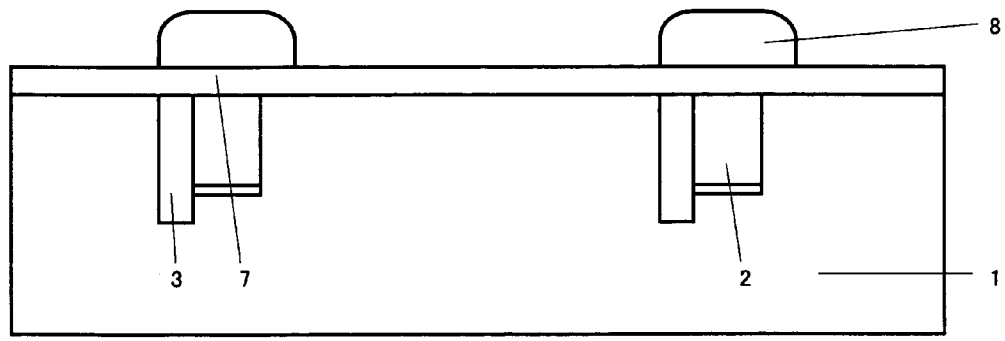

Subsequently, as shown in FIG. 2C, the transfer electrode 8 is patterned by etching the electrode layer of the first layer which has been isotropically etched in the direction perpendicular to the surface of semiconductor substrate 1 by means of well known anisotropic dry etching. After that, 300 sccm of $CF_4$ gas and 120 sccm of $O_2$ gas are mixed while maintaining a pressure of 50 Pa and the mixed gas is excited by means of microwaves so that the generated radicals are carried into a chamber in which a wafer is placed through a wave guide and, thus, the wafer is processed with the plasma as shown in FIG. 2C, thereby forming the transfer electrode 8. At this time, the selective ratio is maintained at, for example, 20 or more so that the gate insulating film 7 has a sufficient film thickness when processing is carried out.

After that, the transfer electrode 8 of the first layer is used as a mask to carry out impurity ion implantation for the formation of the transfer part of, for example, a horizontal resistor (not shown in FIGS. 1 and 2A to 2D) and, then, thermal oxidation or the like is carried out on the surface of the transfer electrode 8 of the first layer, so that the interlayer insulating film 9 is formed.

Figure 2D:
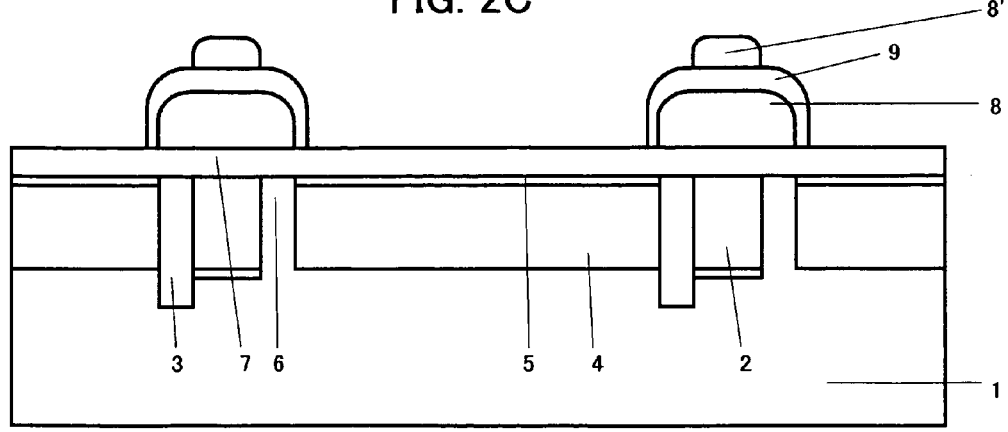

Next, as shown in FIG. 2D, a transfer electrode 8' is formed of polycrystal silicon of the second layer. At this time, the shoulders of the transfer electrode 8 of the first layer are rounded in form; therefore, the concentration of the electrical field is relieved between the upper end of the transfer electrode 8 of the first layer and the transfer electrode 8' of the second layer, so that defective insulation between the electrodes 8 and 8' can be eliminated.

Subsequently, impurities are implanted using the transfer electrodes 8 and 8' made of the first and second polycrystal silicon layers as a mask, thereby forming the light receiving region 4 and the hole accumulating region 5 and, after that, the interlayer insulating film is formed on the transfer electrode 8' of the second layer by means of oxidation or LP-CVD.

Next, the light blocking film 10 made of, for example, tungsten is formed on the entire surface of the inventive device. Then, a photoresist film is selectively formed on the light blocking film 10 and the light blocking film 10 is selectively etched using this photoresist film as a mask, thereby forming the aperture 11 above the light receiving region 4. Further, the gate insulating film 7 is subsequently etched (although not shown), thereby removing the gate insulating film 7 or an oxide film beneath the aperture 11 that has been formed through oxidation after the formation of the transfer electrode 8' of the second layer or that has been formed by means of LP-CVD. Thus, the surface of the semiconductor substrate 1 of the portion of the light receiving region 4 is exposed.

After that, the passivation film 12, the planar film 13, the color filter layer 14 and the on-chip lens 15 are formed according to the same method as in the prior art, so that the inventive device is fabricated.

As described above, according to the inventive method shown in FIGS. 2A to 2D, the upper peripheral portions (shoulders) of the transfer electrode 8 are processed to have tapered forms, so that the inventive device having a rounded form in the cross section can be fabricated as shown in FIG. 1. Here, the transfer electrodes 8 and 8' of the first and second layers are simplified and illustrated as one layer in FIG. 1.

Here, in the case of only a single layer of polycrystal silicon in the inventive device or according to the inventive method, it is unnecessary to form the transfer electrode 8' of the second layer. Most CMOS type solid-state image pickup devices have one layer of polycrystal silicon while two layers of polycrystal silicon are laminated in many structures of CCD type solid-state image pickup devices. Though, in the case of two layers of polycrystal silicon, the upper peripheral portions (shoulders) of the transfer electrode 8 of the first layer are processed to have tapered forms in the above-described embodiment, the transfer electrode 8 of the first layer may be processed through anisotropic etching so that the side walls become perpendicular to the semiconductor substrate 1 in the same manner as in the prior art and the transfer electrode 8' of the second layer may be processed so that the upper peripheral portions (shoulders) thereof have tapered forms. In addition, both transfer electrodes 8 and 8' of the first and the second layers may be processed so that the upper peripheral portions (shoulders) thereof have tapered forms.

The inventive device is not limited to the structure, form and dimensions as described in the above embodiment. In addition, the inventive method is not limited to the processes and treatment conditions as described in the above embodiment.

As described above in detail, according to the present invention, the corners of the transfer electrodes adjacent to the light receiving region are rounded, so that the efficiency of the light convergence increases and an increase in the sensitivity of each light receiving region can be achieved. In addition, according to the present invention, defective insulation due to electrical field concentration between floating transfer electrodes can be prevented in the case where transfer electrodes exist in a plurality of layers.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor light receiving device, comprising:
    a light receiving region formed on a semiconductor substrate;
    an electrode formed in a peripheral portion of the light receiving region on the semiconductor substrate in order to transfer charges generated through photoelectric conversion in the light receiving region to the outside of the light receiving region; and
    a light blocking film overlying the electrode with an opening at the light receiving region, wherein
    a part of or an entirety of a peripheral portion of the electrode is rounded so as to recede toward the center of the electrode as the electrode goes away from the semiconductor substrate.

2. The semiconductor light receiving device according to claim 1, wherein
    the upper peripheral portion of the electrode is processed so as to recede toward the center of the electrode as the electrode goes away from the semiconductor substrate.

3. A semiconductor light receiving device according to claim 1, wherein said part or entirety of said peripheral portion of the electrode is processed by using at least one of each of two types of etching, isotropic etching and anistropic etching, at the time of the pattern formation of the electrode.

4. The semiconductor light receiving device according to claim 3, wherein
    the anisotropic etching is carried out after the isotropic etching has been carried out at the time of the pattern formation of the electrode.

5. The semiconductor light receiving device according to claim 3 or 4, wherein
    the isotropic etching is carried out on the electrode using radicals that include at least one type of gas from among $SF_4$, $CF_4$, $CHF_3$, $CH_2F_2$, $CH_3F$, $C_2F_6$, $C_4F_8$ and $C_5F_8$ as well as at least one type of gas from among Ar, $N_2$ and $O_2$.

* * * * *